United States Patent
Yoo et al.

(10) Patent No.: US 7,710,706 B2
(45) Date of Patent: May 4, 2010

(54) APPARATUS AND METHOD FOR DEMAGNETIZING SHADOW MASK

(75) Inventors: Choong-Keun Yoo, Incheon (KR); Kang-Ju Lee, Gyeonggi-do (KR)

(73) Assignee: LG. Display Co., Ltd., Seoul (KR)

( * ) Notice: Subject to any disclaimer, the term of this patent is extended or adjusted under 35 U.S.C. 154(b) by 360 days.

(21) Appl. No.: 11/821,151

(22) Filed: Jun. 22, 2007

(65) Prior Publication Data
US 2007/0296324 A1    Dec. 27, 2007

(30) Foreign Application Priority Data
Jun. 22, 2006    (KR) ..................... 10-2006-0056363

(51) Int. Cl.
*H01F 13/00*    (2006.01)
(52) U.S. Cl. ...................... 361/149; 361/267
(58) Field of Classification Search ......... 361/143–149, 361/267; 438/531
See application file for complete search history.

(56) References Cited

U.S. PATENT DOCUMENTS

| | | | | |
|---|---|---|---|---|
| 4,715,940 A * | 12/1987 | Boudreau | .................... | 427/585 |
| 5,216,326 A * | 6/1993 | Lundgren | ....................... | 315/8 |
| 5,260,626 A * | 11/1993 | Takase et al. | .................. | 315/85 |
| 5,870,269 A * | 2/1999 | Ikeda et al. | ................. | 361/149 |
| 6,955,726 B2 * | 10/2005 | Kang et al. | ................. | 118/720 |
| 6,963,163 B2 * | 11/2005 | Nakatera et al. | ............. | 313/402 |
| 7,196,894 B2 * | 3/2007 | Maurer et al. | ................ | 361/149 |
| 7,212,277 B2 * | 5/2007 | Miyajima et al. | .............. | 355/75 |
| 7,239,934 B2 * | 7/2007 | Morinaga et al. | ........... | 700/121 |
| 7,249,925 B2 * | 7/2007 | del Puerto et al. | ....... | 414/331.14 |
| 7,318,697 B2 * | 1/2008 | Wu et al. | ..................... | 414/412 |
| 7,318,718 B2 * | 1/2008 | Ueno | ....................... | 425/174.4 |
| 7,461,663 B2 * | 12/2008 | Kinomura et al. | ......... | 134/104.1 |
| 7,525,639 B2 * | 4/2009 | Yamada | ........................ | 355/55 |
| 7,525,643 B2 * | 4/2009 | Butler | .......................... | 355/72 |
| 2006/0197935 A1 * | 9/2006 | Edo | ............................ | 355/75 |
| 2006/0240669 A1 * | 10/2006 | Kaneko et al. | .............. | 438/680 |
| 2007/0002516 A1 * | 1/2007 | Matsumoto | ................ | 361/234 |
| 2007/0126322 A1 * | 6/2007 | Chiou et al. | ............. | 312/249.8 |
| 2008/0203302 A1 * | 8/2008 | Gunji et al. | .................. | 250/311 |
| 2009/0161098 A1 * | 6/2009 | Katou et al. | ............. | 356/237.5 |

FOREIGN PATENT DOCUMENTS

| | | |
|---|---|---|
| JP | 08-090254 | 4/1996 |
| JP | 08-212921 | 8/1996 |

OTHER PUBLICATIONS

Office Action issued in corresponding Chinese Patent Application No. 200710111426.4; issued Jun. 5, 2009.

* cited by examiner

*Primary Examiner*—Jared J Fureman
*Assistant Examiner*—Christopher J Clark
(74) *Attorney, Agent, or Firm*—Brinks Hofer Gilson & Lione

(57) ABSTRACT

An apparatus for demagnetizing a shadow mask includes a shadow mask stocker, a cassette in the shadow mask stocker, wherein at least one shadow mask is disposed in the cassette, and a demagnetizing device that generates a magnetic field by an alternating current (AC), thereby removing magnetism of the at least one shadow mask.

14 Claims, 6 Drawing Sheets

APPARATUS AND METHOD FOR DEMAGNETIZING SHADOW MASK

This application claims the benefit of Korean Patent Application No. 10-2006-0056363, filed in Korea on Jun. 22, 2006, which is hereby incorporated by reference for all purposes as if fully set forth herein.

TECHNICAL FIELD

The present disclosure relates to an apparatus including a shadow mask, and more particularly, to an apparatus and a method for demagnetizing the shadow mask.

BACKGROUND

In organic electroluminescent display devices or semiconductor devices, a thin film pattern may be formed on a substrate by using a shadow mask having desired patterns. More particularly, the shadow mask and the substrate are disposed over a source such that the shadow mask is interposed between the substrate and the source. Then, the source is evaporated and deposited on the substrate through the shadow mask.

In general, a shadow mask is attached to a substrate holder with a substrate in a chamber. The shadow mask and the substrate may be fixed to the substrate holder by a mechanical fixing method or a magnetic fixing method. In the mechanical fixing method, sides of the substrate holder, the shadow mask and the substrate may be mechanically fixed using pins or clips. In the magnetic fixing method, the shadow mask is formed of a magnetic substance, and the substrate and the shadow mask may be magnetically fixed to the substrate holder by permanent magnets or electromagnets.

In the magnetic fixing method, the shadow mask may be magnetized, and adjacent patterns of the shadow mask are contacted to each other due to the magnetization, causing undesirable patterns on the substrate.

FIGS. 1 and 2 are views illustrating an apparatus for forming a thin film using a magnetic shadow mask according to the related art.

As shown in FIG. 1, a shadow mask 102 is disposed over a mask holder 103 in a process chamber 101. A substrate 105 is disposed over a substrate holder 104, which is set up over shadow mask 102 in the process chamber 101.

The shadow mask 102 is formed of an invar, which is an alloy of ferromagnetic iron and nickel and has a relatively low coefficient of thermal expansion. The shadow mask 102 is perforated corresponding to patterns.

Two cross patterns (not shown) are formed on each of the substrate 105 and the shadow mask 102. While the cross patterns are monitored through charge-coupled device (CCD) cameras 106, the substrate 105 moves in an x, y, z or θ direction according to images from the CCD cameras 106. Therefore, the substrate 105 and the shadow mask 102 are aligned with each other such that the cross patterns of the substrate 105 overlap those of the shadow mask 102. Like this, to align the substrate 105 and the shadow mask 102, two CCD cameras 106 and two cross patterns for each of the substrate 105 and the shadow mask 102 are required.

As shown in FIG. 2, when the substrate 105 and the shadow mask 102 are exactly aligned, a chuck 107 goes down and fixes the substrate 105. A magnet 108 is disposed at a bottom of the chuck 107 and prevents the shadow mask 102 from hanging down. Accordingly, the shadow mask 102 including the ferromagnetic materials is easily fixed by the magnet 108 of the chuck 107. Then, a source (not shown) is evaporated and is deposited on the substrate 105 through the shadow mask 102 to form thin film patterns.

By the way, the shadow mask 102 may be magnetized depending on a magnetic field strength of the magnet 108, causing problems.

That is, the substrate 105 and the shadow mask 102 are fixed by the magnet 108 of the chuck 107, which is ferromagnetic, and then the thin film patterns are formed on the substrate 105. At this time, the shadow mask 102 may be magnetized. After that, the magnet 108 of the chuck 107 moves upward. Then, the shadow mask 102 may be demagnetized, and the magnetism of the shadow mask 102 may be removed.

However, the shadow mask 102 is still magnetized.

FIG. 3 shows a magnetized shadow mask of the related art. In FIG. 3, the shadow mask 102 may be a grill type. When the shadow mask 102 is fixed with the substrate 102 by the magnet 108 of FIG. 2, the shadow mask 102 may be magnetized. After forming the thin film patterns and removing the magnet 108, the shadow mask 102 is still magnetized, and thus adjacent grill patterns of the shadow mask 102 may be contacted to each other. Therefore, thin film patterns may be improperly formed due to the contacted grill patterns of the shadow mask 102 in a subsequent process. Defects may be caused in a display device.

SUMMARY

Accordingly, the present embodiments are directed to a liquid crystal display device that may substantially obviate one or more problems due to limitations and disadvantages of the related art. Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

In a first aspect, an apparatus for demagnetizing a shadow mask includes a shadow mask stocker, a cassette in the shadow mask stocker, wherein at least one shadow mask is disposed in the cassette, and a demagnetizing means generating a magnetic field by an alternating current (AC), thereby removing magnetism of the at least one shadow mask.

In a second aspect, a method of demagnetizing a shadow mask includes disposing at least one shadow mask in a shadow mask stocker having a demagnetizing means therein, applying an alternating current (AC) to the demagnetizing means, thereby generating a magnetic field, and removing magnetism of the at least one shadow mask by the magnetic field.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated in and constitute a part of this specification, illustrate embodiments of the disclosure and together with the description serve to explain the principles of the disclosure. In the drawings.

DETAILED DESCRIPTION

Reference will now be made in detail to the embodiments of the present disclosure, examples of which are illustrated in the accompanying drawings.

Figure 4:
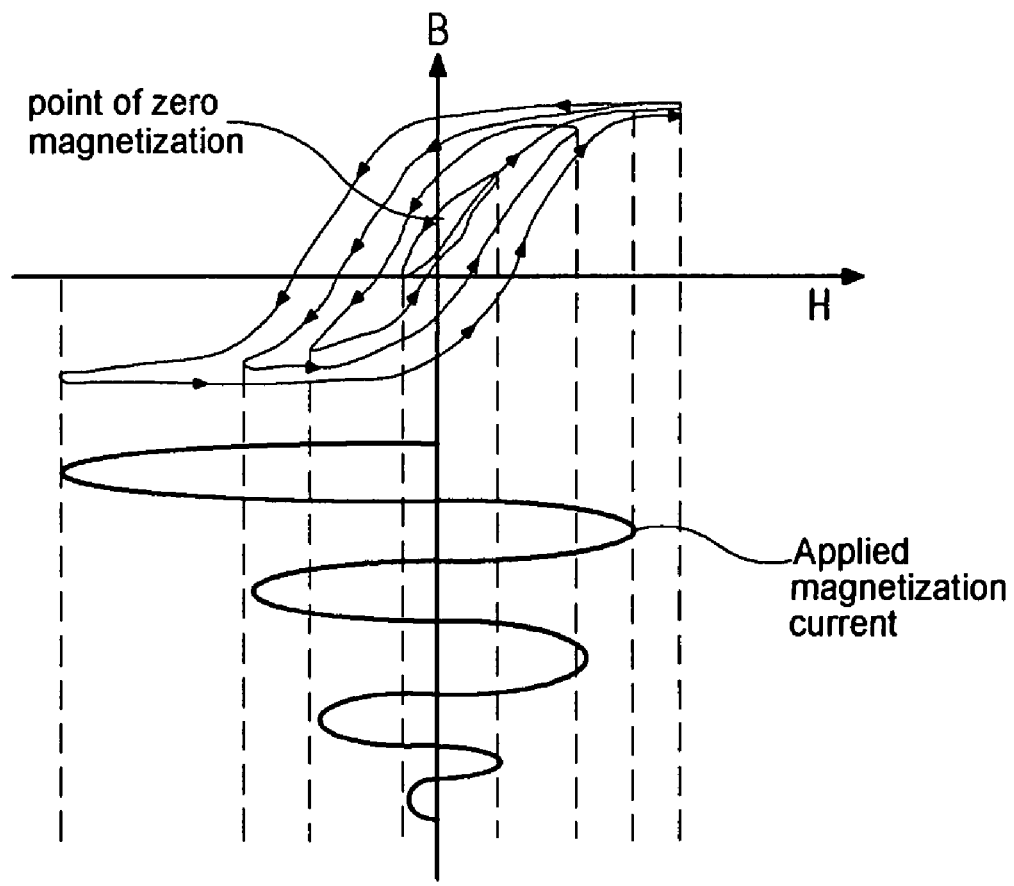
FIG. 4 is a graph showing a principle of demagnetizing a shadow mask.

FIG. 4 is a graph showing a principle of demagnetizing a shadow mask. FIG. 4 illustrates magnetic flux density B of the shadow mask as function of magnetic field strength H depending on magnetic fields applied to the shadow mask.

In FIG. 4, the shadow mask has magnetic hysteresis properties depending on the applied magnetic fields. By applying magnetization currents of alternating current (AC) to the shadow mask, the magnetization of the shadow mask is gradually decreased until the magnetism of the shadow mask becomes zero.

More particularly, the shadow mask 102 is magnetized due to the magnetic field of the magnet 108 such that spins of electrons are aligned along a certain direction. If electric fields of alternating current (AC) are applied to the shadow mask 102 in various ways, directions of the spins of the electrons alternately change according as a polarity of periodic AC varies. At this time, if the AC decreases, a changing extent of the spins of the electrons is also lowered, and finally, the magnetization of the shadow mask 102 becomes zero.

Figure 5:
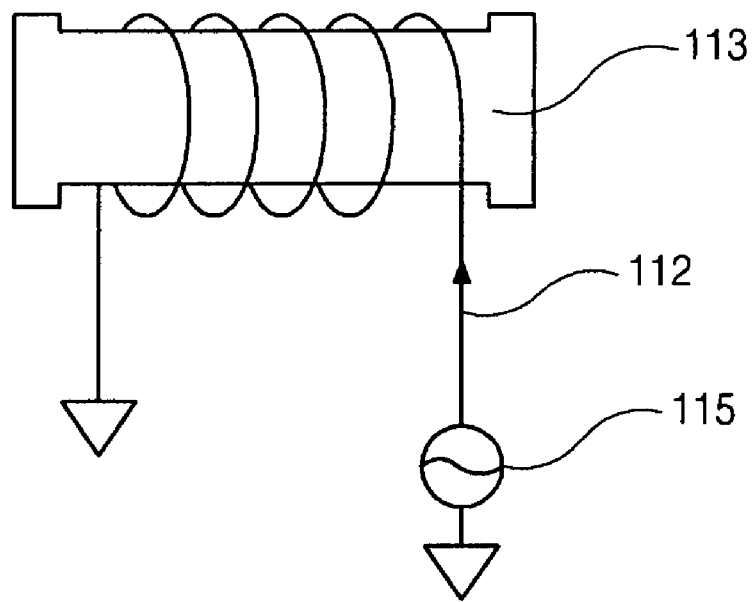
FIG. 5 is a view illustrating a principle of a solenoid used for a demagnetizing apparatus.
Figure 6:
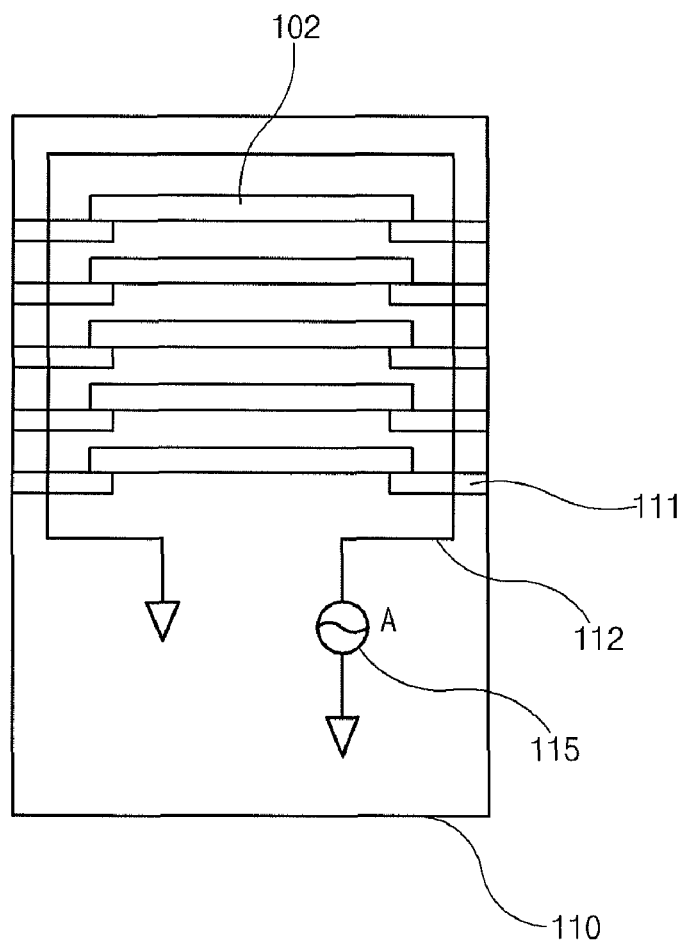
FIG. 6 is a view schematically illustrating a demagnetizing apparatus using a solenoid according to a first embodiment.

FIG. 5 is a view illustrating a principle of a solenoid used for a demagnetizing apparatus, and FIG. 6 is a view schematically illustrating a demagnetizing apparatus using a solenoid according to a first embodiment.

In FIG. 5, a coil 112 is wrapped around a magnetic substance 113, and AC from an AC power source 115 is applied to the coil 112.

In FIG. 6, a solenoid is set up in a shadow mask stocker 110. A plurality of shadow masks 102 are disposed in a cassette 111, and a coil 112 is tubularly installed around the shadow masks 102, wherein the shadow masks 102 function as a magnetic substance. An AC power source 115 is connected to the coil 112.

If gradually decreasing AC from the AC power source 115 is applied to the coil 112, the shadow masks 102 are demagnetized. The coil 112, desirably, may be disposed at a side of a gate for carrying the shadow masks 102 in and out so that the shadow masks 102 can be carried in and out without hindrance.

Figure 7:
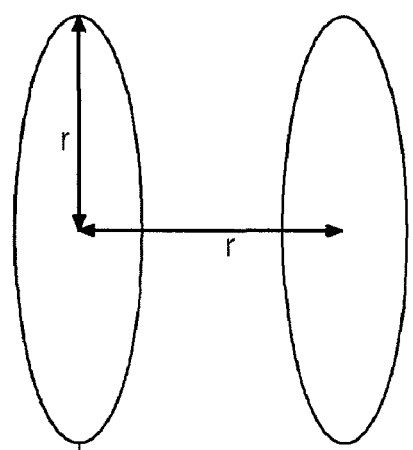
FIG. 7 is a view illustrating a principle of a Helmholtz coil used for a demagnetizing apparatus.
Figure 8:
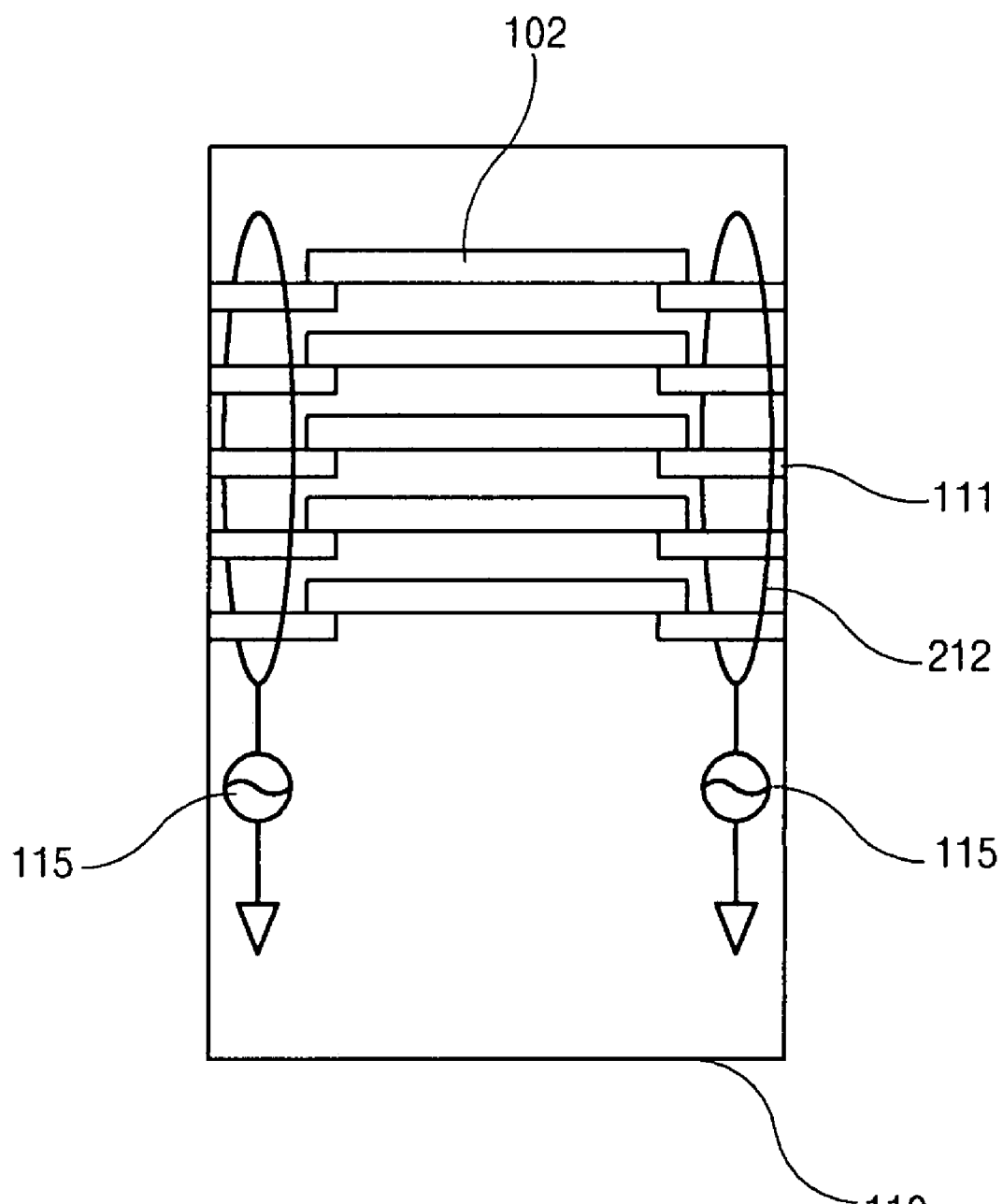
FIG. 8 is a view schematically illustrating a demagnetizing apparatus using a Helmholtz coil according to a second embodiment.

FIG. 7 is a view illustrating a principle of a Helmholtz coil used for a demagnetizing apparatus, and FIG. 8 is a view schematically illustrating a demagnetizing apparatus using a Helmholtz coil according to a second embodiment.

In FIG. 7, two parallel ring-shaped coils 212 are wound around a non-magnetized coil former (not shown) such that a radius "r" of the coils 212 is equal to a distance between the coils 212, and thus an magnetic field is uniformly induced in a central portion.

When a current "I" flows through each coil 212 in the same direction, at a point which is at "x" distant from a center of one of the coils 212, a magnetic field is expressed as follows:

$$H = \frac{NI}{2r}\left[\left(1+\frac{x^2}{r^2}\right)^{-\frac{3}{2}} + \left(1+\left(\frac{r-x}{r}\right)^2\right)^{-\frac{3}{2}}\right],$$

wherein "N" is the number of wire loops in one coil, and "r" is a radius of the coil.

In the same number of wire loops and the same current, a magnetic field induced by the Helmholtz coil is relatively weak but generally uniform in a wide range as compared to that by the solenoid. Therefore, the Helmholtz coil is useful for the case of generating a magnetic field that is uniform in a wide range.

In FIG. 8, a Helmholtz coil is set up in a shadow mask stocker 110. Two parallel ring-shaped coils 212 are disposed at opposite sides of a cassette 111, wherein the coils 212 are separated with a distance equal to a radius of the coils 212. An AC power source 115 is connected to the coils 212.

If gradually decreasing AC from the AC power source 115 is applied to the coils 212, the shadow masks 102 disposed between the coils 212 are demagnetized. The cassette 111, which the coils 212 are set up to, may be formed of a non-magnetized material.

A method of demagnetizing the shadow mask will be described hereinafter in more detail with reference to accompanying drawings.

Figure 1:
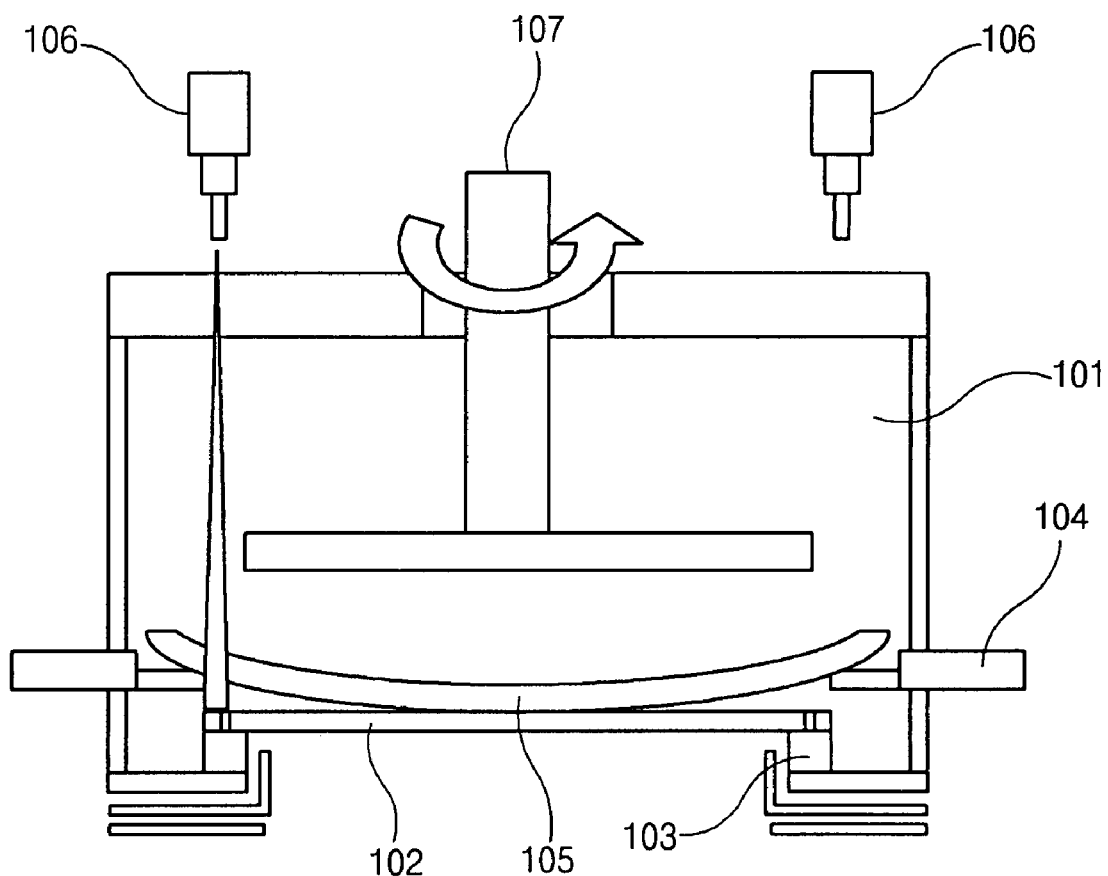
FIGS. 1 and 2 are views illustrating an apparatus for forming a thin film using a magnetic shadow mask according to the related art.
Figure 2:
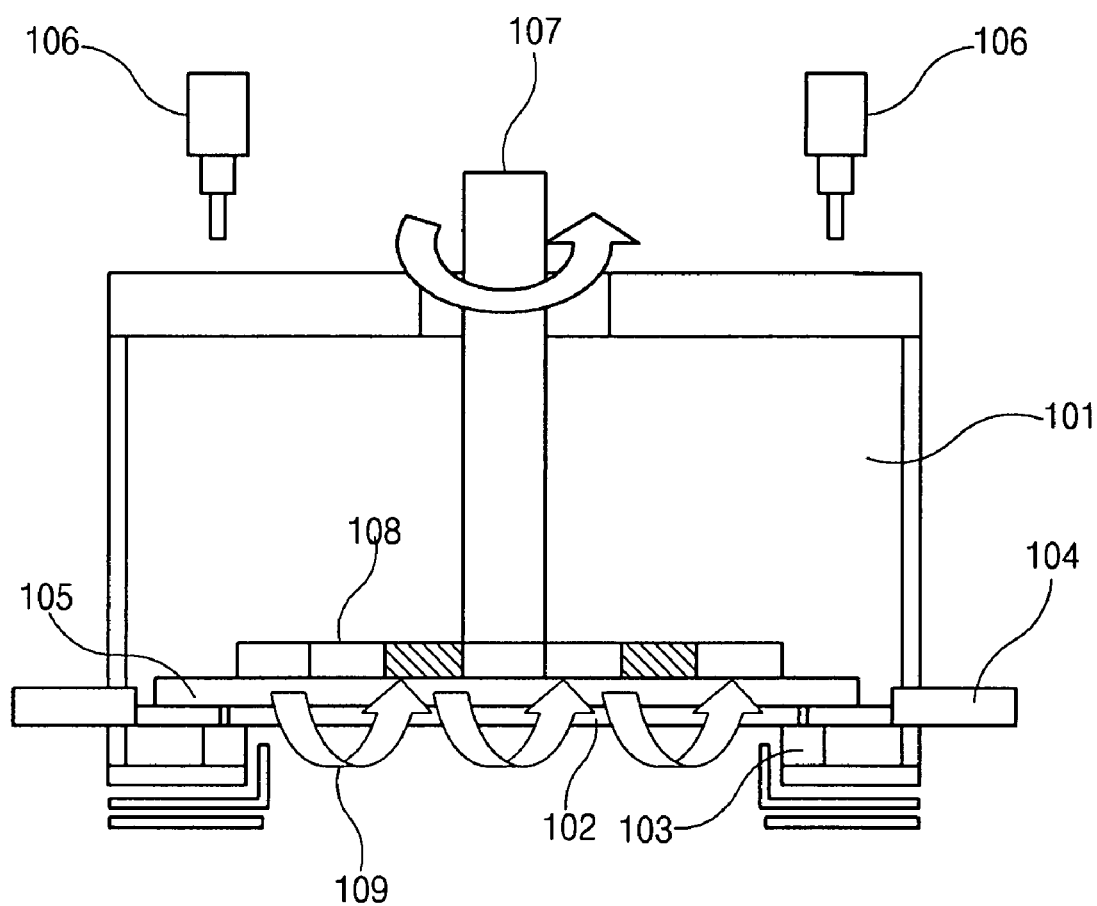
Figure 3:
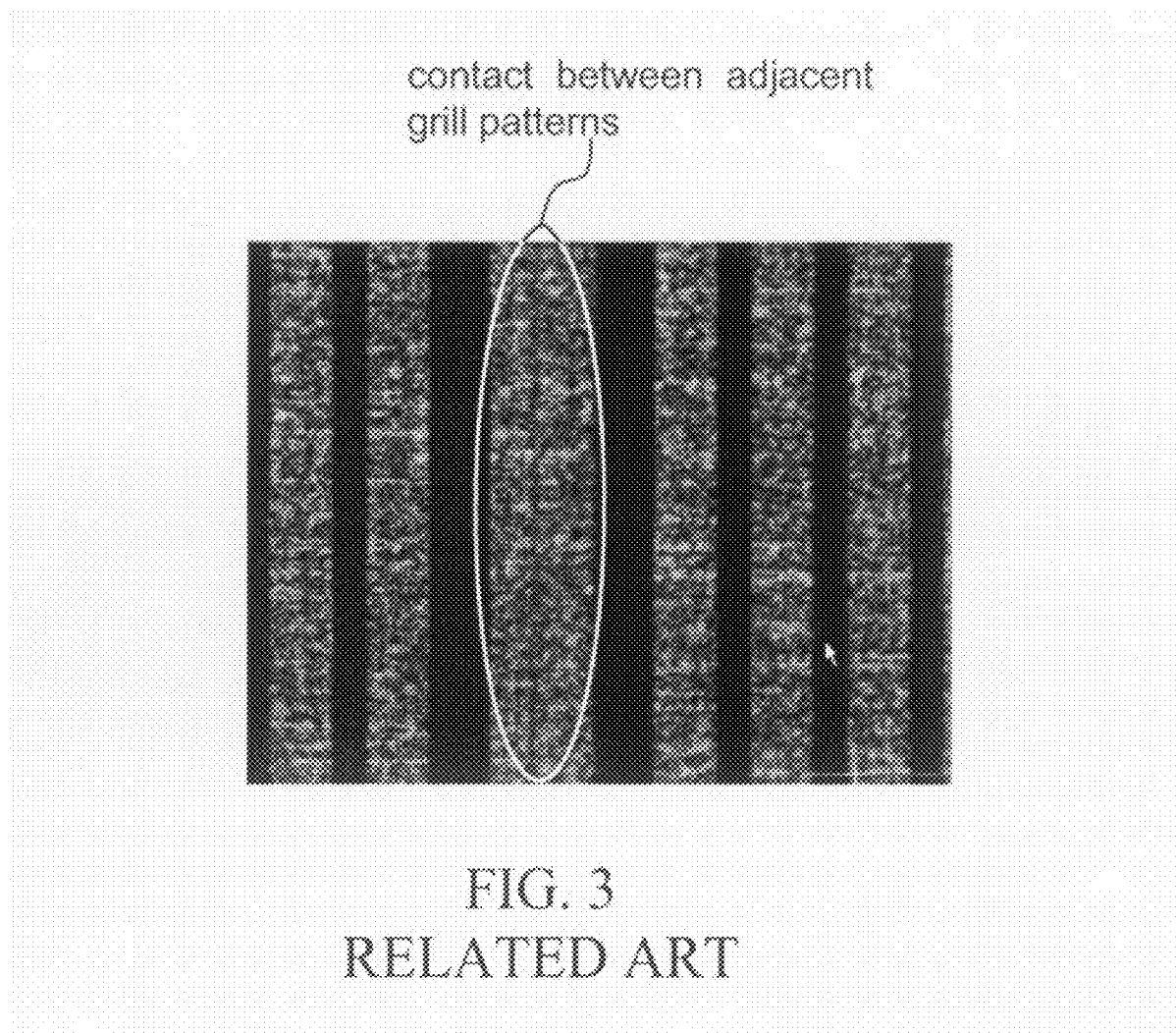
FIG. 3 shows a magnetized shadow mask of the related art.

First, referring to FIGS. 1 and 2, the shadow mask 102 and the substrate 105 are disposed in the chamber 101, and the shadow mask 102 and the substrate 105 are aligned with each other such that the cross patterns of the substrate 105 overlap those of the shadow mask 102. The shadow mask 102 and the substrate 105 are fixed by the chuck 107, the bottom of which the magnet 108 is combined with. Then, a thin film is formed on the substrate 105 from the patterns of the shadow mask 102 by an evaporation method or one of other deposition methods, and the chuck 107 is separated from the shadow mask 102 and the substrate 105. The shadow mask 102 is transferred to the shadow mask stocker 110.

At this time, the shadow mask 102 is magnetized by the magnet 108 at the bottom of the chuck 107. Referring to FIGS. 6 and 8, decreasing AC is applied to a demagnetizing means, such as the coil 112 of FIG. 6 or the coils 212 of FIG. 8, and the shadow mask 102 is demagnetized.

After that, even though the shadow mask 102 is used in the next process, there is no pattern problem because the shadow mask 102 is completely demagnetized and the patterns of the shadow mask 102 are not connected to each other.

In the present invention, a demagnetizing means is set up to a shadow mask stocker, and the shadow mask is demagnetized by the demagnetizing means. Therefore, the patterns of the shadow mask may be prevented from being connected due to the magnetization of the shadow mask. This may decrease the number of defective products and increase production yields.

It will be apparent to those skilled in the art that various modifications and variations can be made in the liquid crystal display device of the present invention without departing from the spirit or scope of the invention. Thus, it is intended that the present invention cover the modifications and variations of this invention provided they come within the scope of the appended claims and their equivalents.

What is claimed is:

1. An apparatus for demagnetizing a shadow mask, the apparatus comprising:
   a shadow mask stocker;

a cassette in the shadow mask stocker, wherein at least one shadow mask is disposed in the cassette; and a demagnetizing means that generates a magnetic field by an alternating current (AC), thereby removing magnetism of the at least one shadow mask.

2. The apparatus according to claim 1, wherein the demagnetizing means includes a coil and an AC power source connected to the coil.

3. The apparatus according to claim 2, wherein the coil is tubularly disposed around the at least one shadow mask and the AC power source applies the AC to the coil.

4. The apparatus according to claim 1, wherein the demagnetizing means includes two coils and an AC power source connected to the coils.

5. The apparatus according to claim 4, wherein the coils are ring-shaped and respectively disposed at opposite sides of the cassette substantially in parallel such that the at least one shadow mask is disposed between the coils.

6. The apparatus according to claim 5, wherein a distance between the coils substantially equals to a radius of the coils.

7. The apparatus according to claim 4, wherein currents through the coils flow along a same direction.

8. The apparatus according to claim 1, wherein the cassette is formed of a non-magnetized material.

9. A method of demagnetizing a shadow mask, the method comprising:

disposing at least one shadow mask in a shadow mask stocker having a demagnetizing means therein;

applying an alternating current (AC) to the demagnetizing means, thereby generating a magnetic field; and removing magnetism of the at least one shadow mask by the magnetic field.

10. The method according to claim 9, wherein the demagnetizing means includes one of a solenoid and a Helmholtz coil.

11. The method according to claim 9, wherein applying the AC to the demagnetizing means includes decreasing the AC.

12. A method for fabricating an electronic device using a shadow mask, the method comprising:

demagnetizing the shadow mask, the demagnetizing the shadow mask step comprising disposing at least one shadow mask in a shadow mask stocker having a demagnetizing means therein, applying an alternating current (AC) to the demagnetizing means, thereby generating a magnetic field, and removing magnetism of the at least one shadow mask by the magnetic field.

13. The method according to claim 12, wherein the demagnetizing means includes one of a solenoid and a Helmholtz coil.

14. The method according to claim 12, wherein applying the AC to the demagnetizing means includes decreasing the AC.

* * * * *